(12) United States Patent
Umezaki et al.

(10) Patent No.: US 9,842,751 B2
(45) Date of Patent: Dec. 12, 2017

(54) SUBSTRATE LIQUID PROCESSING APPARATUS

(71) Applicant: Tokyo Electron Limited, Tokyo (JP)

(72) Inventors: Shouta Umezaki, Kumamoto (JP); Yoshihiro Kai, Kumamoto (JP); Kazuki Kosai, Kumamoto (JP); Mitsuo Tanaka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 29 days.

(21) Appl. No.: 14/922,441

(22) Filed: Oct. 26, 2015

(65) Prior Publication Data
US 2016/0114345 A1 Apr. 28, 2016

(30) Foreign Application Priority Data
Oct. 28, 2014 (JP) .................. 2014-219315

(51) Int. Cl.
*B05B 1/28* (2006.01)
*B05C 11/02* (2006.01)
*H01L 21/67* (2006.01)

(52) U.S. Cl.
CPC ............ *H01L 21/6708* (2013.01); *B05B 1/28* (2013.01); *B05C 11/02* (2013.01); *H01L 21/67051* (2013.01)

(58) Field of Classification Search
USPC .......... 118/52, 612, 319, 320, 326; 427/240; 134/153, 198, 902
See application file for complete search history.

(56) References Cited

U.S. PATENT DOCUMENTS 7,153,364 B1 * 12/2006 Rangarajan ............. B05B 15/02
118/323
2014/0352726 A1 * 12/2014 Itoh ..................... H01L 21/6715
134/10

FOREIGN PATENT DOCUMENTS

| JP | 2013-093361 A | 5/2013 | |
| JP | WO 2013061950 A1 * | 5/2013 | ......... H01L 21/6715 |
| KR | 2014-0065655 A | 5/2014 | |

* cited by examiner

*Primary Examiner* — Yewebdar Tadesse
(74) *Attorney, Agent, or Firm* — Abelman, Frayne & Schwab

(57) ABSTRACT

Disclosed is a substrate liquid processing apparatus. The apparatus includes: a substrate holding unit configured to hold a substrate horizontally; a nozzle configured to eject a processing liquid in a transversal direction toward a liquid arrival target position set on the substrate held by the substrate holding unit from an ejection port which is located at an injection position spaced away from the liquid arrival target position by a predetermined distance horizontally; and a liquid receiving unit provided below the nozzle to receive the processing liquid dropping from the ejection port of the nozzle.

10 Claims, 6 Drawing Sheets

SUBSTRATE LIQUID PROCESSING APPARATUS

CROSS-REFERENCE TO RELATED APPLICATIONS

This application is based on and claims priority from Japanese Patent Application No. 2014-219315, filed on Oct. 28, 2014, with the Japan Patent Office, the disclosure of which is incorporated herein in its entirety by reference.

TECHNICAL FIELD

The present disclosure relates to a substrate liquid processing apparatus for performing a liquid processing on a substrate using a processing liquid.

BACKGROUND

When performing a wet etching processing or a cleaning processing on a substrate such as, for example, a semiconductor wafer, a single type substrate processing apparatus is frequently used. The single type substrate processing apparatus includes a spin chuck configured to hold a substrate horizontally and rotate the substrate around a vertical axis, and a nozzle configured to supply a processing liquid to a top surface of the rotating substrate. In many cases, the nozzle is attached to a movable arm to be movable between a processing position just above the substrate and a standby position located outside the substrate. When located at the processing position, the nozzle ejects the processing liquid vertically downwardly.

In addition to or instead of the vertically downward ejection type nozzle, a nozzle may be provided in some cases in a type of ejecting a processing liquid transversely (substantially horizontally) toward the central portion of the top surface of the substrate from the outside of the substrate (see, e.g., Japanese Patent Laid-Open Publication No. 2013-093361). The transversal ejection type nozzle may be usually fixed to a position radially outside the substrate (e.g., to the top surface of a cup), and used for forming a liquid film on the top surface of the substrate in order to prevent the top surface of the substrate from coming in contact with the air, for example, between a substrate processing by a first processing liquid and a substrate processing by a second processing liquid.

The fixed transversal ejection type nozzle has a drawback in that it cannot perform a dummy dispense. This is because when the dummy dispense is performed, a liquid, which may contaminate the spin or the spin chuck, comes in contact with the substrate or the spin chuck. In addition, when the liquid ejected from the nozzle drops onto a constituent member of the substrate liquid processing apparatus below the nozzle (e.g., the top surface of the cup), the constituent member itself may be contaminated. In addition, the liquid splashed from the constituent member may contaminate a member around the constituent member.

SUMMARY

According to an exemplary embodiment, there is provided a substrate liquid processing apparatus that includes: a substrate holding unit configured to hold a substrate horizontally; a nozzle configured to eject a processing liquid in a transversal direction onto the substrate held by the substrate holding unit from an ejection port which is provided outside the substrate; and a liquid receiving unit provided below the nozzle to receive a processing liquid dropping from the ejection port of the nozzle.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
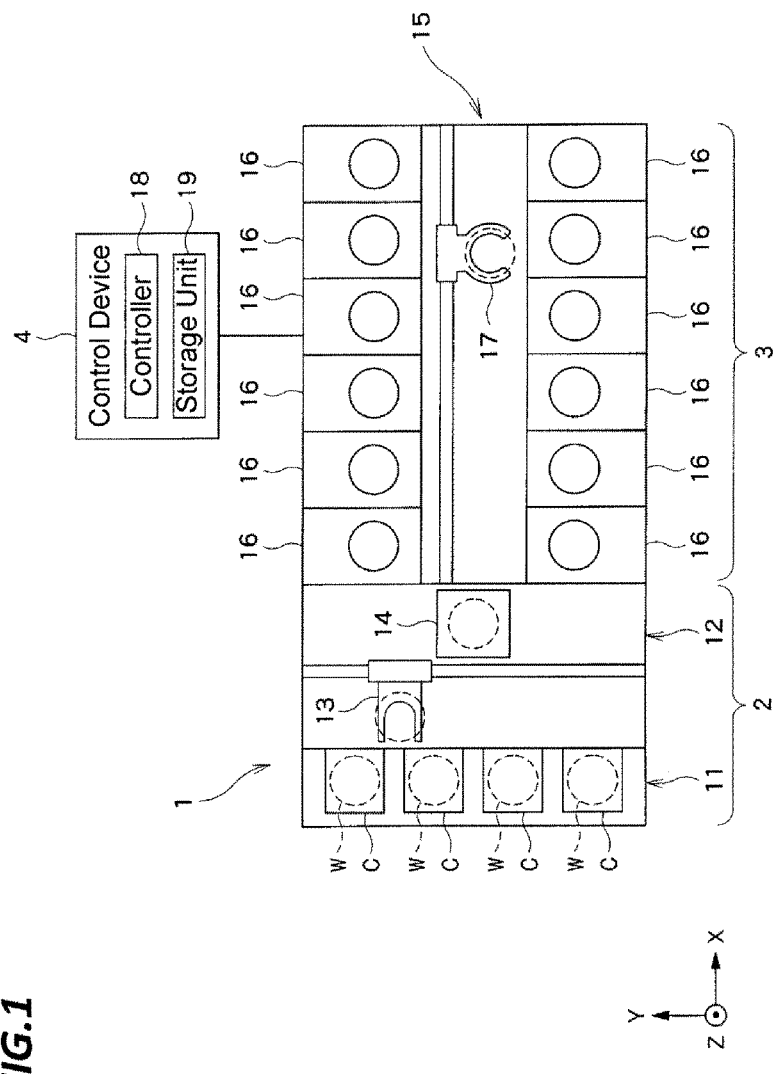
FIG. 1 is a plan view illustrating a schematic configuration of a substrate processing system according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure provides a technology that is capable of preventing a liquid from dropping to a constituent member of a substrate liquid processing apparatus from a transversal ejection type nozzle.

According to an exemplary embodiment of the present disclosure, there is provided a substrate liquid processing apparatus that includes: a substrate holding unit configured to hold a substrate horizontally; a nozzle configured to eject a processing liquid in a transversal direction onto the substrate held by the substrate holding unit from an ejection port which is provided outside the substrate; and a liquid receiving unit provided below the nozzle to receive a processing liquid dropping from the ejection port of the nozzle.

In the substrate liquid processing apparatus described above, the liquid receiving unit includes a liquid receiving member, a first guide wall extending downwardly from an opening end of the ejection port of the nozzle, and a second guide wall facing the first guide wall. A gap is formed between the first guide wall and the second guide wall, through which the processing liquid is guided to the liquid receiving member.

In the substrate liquid processing apparatus described above, a contact angle of the processing liquid in relation to the second guide wall is larger than a contact angle of the processing liquid in relation to the first guide wall.

In the substrate liquid processing apparatus described above, a surface of the first guide wall is positioned on a plane that is the same as that of the opening end of the nozzle.

In the substrate liquid processing apparatus described above, the gap has a size that is smaller to a size of a droplet ejected from the ejection port of the nozzle.

In the substrate liquid processing apparatus described above, the second guide wall is formed integrally with the liquid receiving member.

In the substrate liquid processing apparatus described above, an upper side of the liquid receiving member is covered by a cover.

In the substrate liquid processing apparatus described above, the cover is formed by a portion of a holding member configured to hold the nozzle at a predetermined position.

In the substrate liquid processing apparatus described above, the liquid receiving unit includes an upper liquid receiving member and a lower liquid receiving member located below the upper liquid receiving member.

In the substrate liquid processing apparatus described above, a front end portion of a bottom surface of the upper liquid receiving member is inclined to descend as a horizontal distance from a liquid arrival target position increases, and a horizontal distance of a front end edge of the upper liquid receiving member from the liquid arrival target position is smaller than a horizontal distance of a front end edge of the lower liquid receiving member from the liquid arrival target position.

In the substrate liquid processing apparatus described above further includes a recovery cup disposed around the substrate so as to recover the processing liquid after the processing liquid is supplied to the substrate. The recovery cup includes a ring-shaped rotary cup body configured to rotate around a vertical axis, and the horizontal distance of the front end edge of the upper liquid receiving member from the liquid arrival target position is equal to or smaller than a horizontal distance of an inner peripheral edge of a top surface of the rotary cup body from the liquid arrival target position.

According to the exemplary embodiments described above, since a liquid from the nozzle can be suppressed from dropping to a constituent member of the substrate liquid processing apparatus, the contamination of the constituent member can be suppressed. Further, a member around the constituent member can be suppressed from being contaminated by the liquid splashed from the constituent member.

FIG. 1 is a plan view illustrating a schematic configuration of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of wafers W horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. The processed wafer W placed on the delivery unit 14 returns to the carrier C of the carrier placing section 11 by the substrate transfer device 13.

Figure 2:
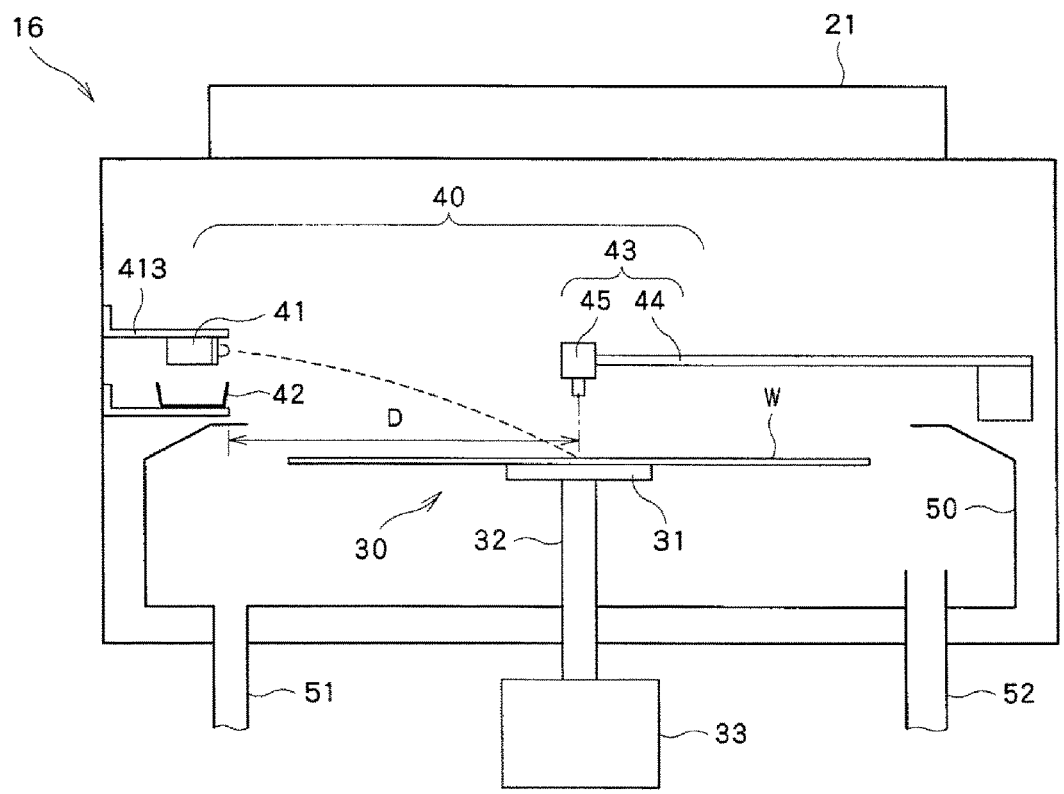
FIG. 2 is a vertical sectional view illustrating a schematic configuration of a processing unit illustrated in FIG. 1.

Next, descriptions will be made on a schematic configuration of a processing unit 16 with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 includes at least one fixed supply unit 41. The fixed supply unit 41 includes a nozzle (corresponding to a nozzle 410 to be described later). The nozzle ejects a processing liquid transversally toward a liquid arrival target position, which is set on the wafer W held by the holding unit 31 (here, e.g., the wafer center or a position in the vicinity thereof), from an ejection port located at an ejection position that is spaced away from the liquid arrival target position by a predetermined distance D in a horizontal direction (e.g., a position outside the wafer W in a plan view and slightly higher than the wafer W). The processing liquid that has dropped to the center of the rotating wafer W spreads by centrifugal force so that the entire surface of the wafer W is covered by the liquid film of the processing liquid. By the processing liquid, a liquid processing such as, for example, cleaning or etching, is performed on the wafer W.

Below the fixed supply unit 41, a liquid receiving unit 42 is provided to receive the fluid that is ejected from the fixed supply unit 41 and drops to the outside of the wafer W. The fixed supply unit 41 is fixed to, for example, a wall of the chamber 20, through a bracket.

The processing fluid supply unit 40 may further include at least one movable supply unit 43. The movable supply unit 43 may be composed of a nozzle arm 44 rotatable around, for example, a vertical axis, and at least one nozzle 45 carried on the front end of the nozzle arm 44. The nozzle 45 is movable between a processing position above the wafer W (e.g., a position where the processing liquid is sent directly downwardly from a location immediately above the center of the wafer W) and a standby position radially outside the wafer W.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

First Exemplary Embodiment of Fixed Supply Unit and Liquid Receiving Unit

Figure 3:
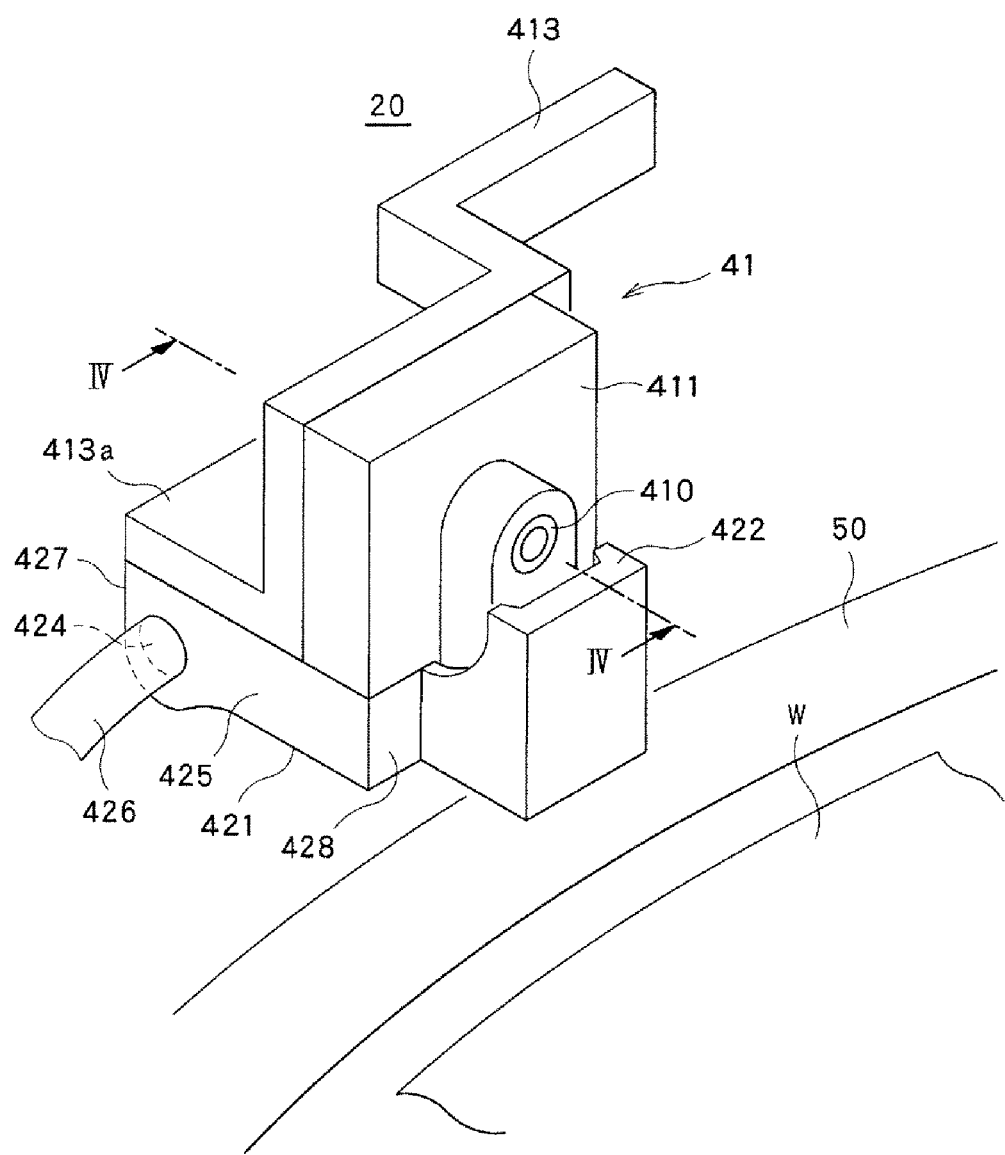
FIG. 3 is a perspective view illustrating a configuration of a fixed supply unit and a liquid receiving unit according to a first exemplary embodiment.

Hereinafter, the first exemplary embodiment of the fixed supply unit 41 and the liquid receiving unit 42, which are schematically illustrated in FIG. 2, will be described with reference to FIGS. 3 to 5. The liquid receiving unit 42 of the first exemplary embodiment is provided in order to prevent the processing liquid, which is ejected from the fixed supply unit 41 at a minute flow rate at the time of dummy dispense from the fixed supply unit 41, from dropping to a constituent member of the processing unit 16 (e.g., the top surface of the recovery cup 50) located below the fixed supply unit 41 disposed within the chamber 20. The "dummy dispense" means an operation of ejecting a processing liquid from a nozzle toward a position different from a processing target substrate (wafer), for the purpose of discarding, for example, a processing liquid having a composition improper for a processing and existing within the nozzle or a supply line connected to the nozzle, or a processing liquid staying for a long period of time, from the inside of the nozzle and the supply line.

The fixed supply unit 41 includes a nozzle 410 and a nozzle holding body 411 that holds the nozzle 410. The nozzle 410 is formed of a cylindrical tubular member, and inserted into a cylindrical nozzle insertion hole 412 formed in the nozzle holding body 411. The nozzle holding body 411 is fixed to a wall of the chamber 20 through a bracket (fixing member) 413. A pipe forming the nozzle 410 also passes through a hole provided in the bracket 413.

Figure 4:
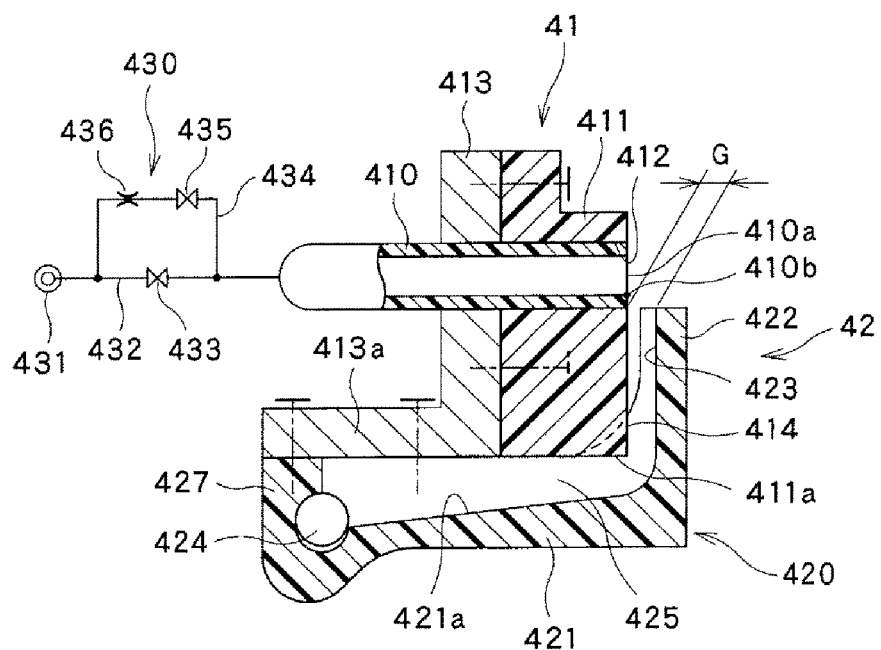
FIG. 4 is a vertical sectional view illustrating the configuration of the fixed supply unit and the liquid receiving unit according to the first exemplary embodiment, which is taken along line IV-IV in FIG. 2.

As illustrated in FIG. 4, the nozzle 410 is connected with a processing liquid supply mechanism 430. The processing liquid supply mechanism 430 includes a processing liquid supply line 432 that supplies a processing liquid from a processing liquid supply source 431 to the nozzle 410. The processing liquid supply line 432 is provided with an opening/closing valve 433. A small flow rate line 434, which bypasses the opening/closing valve 433, is connected to the processing liquid supply line 432. The small flow rate line 434 is provided with an opening/closing valve 435. The small flow rate line 434 has a flow path diameter smaller than that of the processing liquid supply line 432, or an orifice 436 is provided in the small flow rate line 434 as illustrated in FIG. 4.

Figure 5:
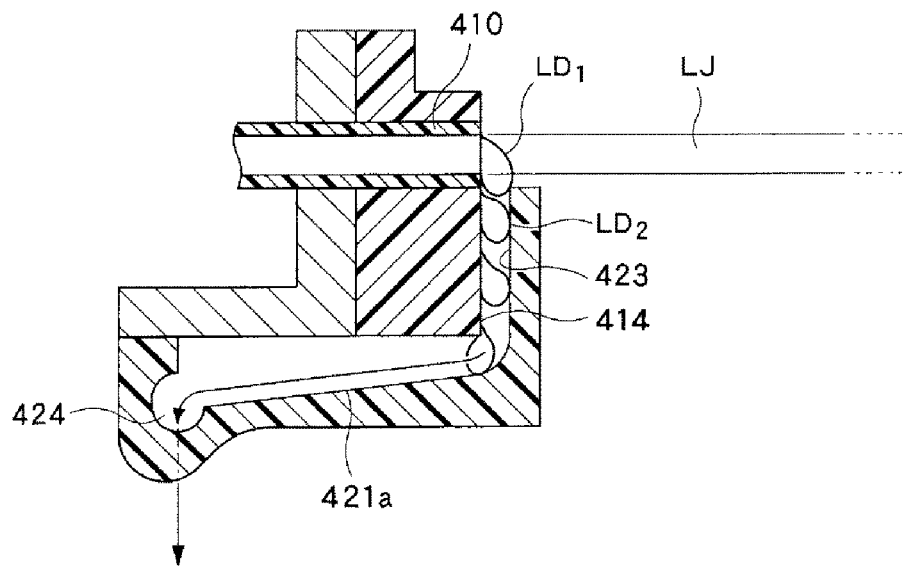
FIG. 5 is a view illustrating an action of the fixed supply unit and the liquid receiving unit according to the first exemplary embodiment.

When the opening/closing valve 433 is opened and the opening/closing valve 435 is closed, the processing liquid is ejected transversely (substantially horizontally) at a normal flow rate from the nozzle 410 (see a liquid flow LJ in FIG. 5). At this time, the processing liquid arrives at the central portion of the rotating wafer W which is the liquid arrival target position (see the broken line extending from the fixed supply unit 41 in FIG. 2). When the opening/closing valve 433 is closed and the opening/closing valve 435 is opened, the processing liquid is ejected from the nozzle 410 at a minute flow rate (see droplets $LD_1$, $LD_2$ in FIG. 5).

The liquid receiving unit 42 includes a liquid receiving tray 420 provided below the nozzle 410. As illustrated in FIGS. 3 and 4, the liquid receiving tray 420 includes a bottom wall 421, and a liquid guide wall 422 extending upwardly from the front end of the bottom wall 421. The height of the upper end of the liquid guide wall 422 is slightly lower than the lowermost portion 410b of the opening end 410a of the nozzle 410. For this reason, the processing liquid ejected horizontally from the nozzle 410 at the normal flow rate does not impinge against the liquid guide wall 422.

The top surface 421a of the bottom wall 421 of the liquid receiving tray 42 is inclined to descend as going away from the liquid guide wall 422. The lowest position of the top surface 421a is formed with a liquid discharge groove 424 that extends from the back side toward the front side of FIG. 4. The liquid discharge groove 424 is inclined to descend as going toward the front side from the back side of the paper of FIG. 4. The lowest portion of the liquid discharge groove 424 is opened through the side wall 425 of the liquid receiving tray 42 as illustrated in FIG. 3, and a liquid discharge tube 426 is connected to the opened portion. The liquid discharge tube 426 extends to the outside of the chamber 20. For this reason, the processing liquid, once introduced into the liquid discharge tube 426, does not affect the atmosphere within the chamber 20 (e.g., humidity).

The nozzle holding body 411 includes a liquid guide surface 414 that extends in parallel to the liquid guide surface 423 of the liquid guide wall 422 which is directed to the nozzle 410. Between the liquid guide surface 423 and the liquid guide surface 414, a gap G is formed. In the exemplary embodiment illustrated in FIG. 4, both the liquid guide surface 423 and the liquid guide surface 414 extend in the vertical direction. The liquid guide surface 423 may be inclined such that the size of the gap G increases as going upward. The size of the gap G is, for example, 2 mm.

From the peripheral edge of the bottom wall 421 of the liquid receiving tray 42, a rear wall 427 (see FIG. 4) and one pair of front walls 428 (positioned at the opposite sides of the liquid guide wall 422) stand in addition to the liquid guide wall 422 and one pair of side walls 425 described above. That is, the top surface 421a of the bottom wall 421 of the liquid receiving tray 42 is surrounded by the walls 422, 425, 427, 428. Since the walls 422, 425, 427, 428 serve as a bank, all the processing liquid introduced into the liquid receiving tray 42 flows out to the liquid discharge groove 424 and the liquid discharge tube 426, but does not flow out to another portion.

The upper side of the top surface 421a of the bottom wall 421 is covered by a portion 413a of the bracket 413 and the bottom surface 411a of the nozzle holding body 411. That is, a portion of the bracket 413 and a portion of the nozzle holding body 411 serve as a cover that covers the upper side of the liquid receiving tray 42. Instead of using the portion of the bracket 413 and the portion of the nozzle holding body 411 as the cover, a dedicated cover may be provided, or the upper side of the liquid receiving tray 42 may be covered only by the bottom surface 411a of the nozzle holding body 411.

A contact angle of the processing liquid in relation to the liquid guide surface 414 of the nozzle holding body 411 is smaller than the contact angle of the processing liquid in relation to the liquid guide surface 423 of the liquid guide wall 422 of the liquid receiving tray 42. For example, when the processing liquid ejected from the nozzle 410 is deionized water (DIW), the relationship between the above-described contact angles is established by forming the nozzle holding body 411 of polyvinyl chloride (PVC), and forming the liquid receiving tray 42 of polytetrafluoroethylene (PTFE).

In the case where the contact angles of the processing liquid in relation to the liquid guide surfaces 414, 423 are equal to each other, a liquid film is easily formed between the liquid guide surfaces 414, 423 so that the processing liquid stays between the liquid guide surfaces 414, 423. As a result, a phenomenon occurs in which the liquid ejected from the nozzle 410 thereafter overflows to the outside and drops rather than entering into the gap G.

Whereas, when the contact angles of the processing liquid in relation to the liquid guide surfaces 414, 423 are set to be different from each other, even if a droplet $LD_1$ larger than the gap G drops to the upper end opening of the gap G to block the gap G, the droplet $LD_1$ is immediately spread flat on the liquid guide surface 414, and the processing liquid becomes a spherical shape on the liquid guide surface 423 (see a droplet $LD_2$), as schematically illustrated in FIG. 5. Since the processing liquid becomes such a shape, no liquid film is formed between the liquid guide surfaces 414, 423 so that the processing liquid smoothly flows into the gap G between the liquid guide surfaces 414, 423 and flows downward. Through a test, it has been found that even if the size of the gap G is about 2 mm, a droplet having a size of about 3 mm just after being ejected from the nozzle 410 (a droplet larger than the gap G) smoothly flows into the gap G.

In addition, it does not matter even if the contact angle of the processing liquid in relation to the liquid guide surface 414 of the nozzle holding body 411 is set to be larger than the contact angle of the processing liquid in relation to the liquid guide surface 423 of the liquid guide wall 422 of the liquid receiving tray 42. However, it may be desirable to set the contact angle of the processing liquid in relation to the liquid guide surface 414 of the nozzle holding body 411 to be smaller than the contact angle of the processing liquid in relation to the liquid guide surface 423 of the liquid guide wall 422 of the liquid receiving tray 42. In addition, in such a case, in order to cause the processing liquid to smoothly flow into the gap G, the opening end 410a forming the ejection port of the nozzle 410 and the liquid guide surface 414 may be positioned on the same plane, as illustrated in FIG. 4.

The size of the gap G may be reduced if the processing liquid smoothly flows into the gap G even if the size of the gap G is reduced. As described above, the upper side of the liquid receiving tray 42 is covered by a portion of the bracket 413 and a portion of the nozzle holding body 411. Thus, when the processing liquid existing on the liquid receiving tray 42 is evaporated, the vapor may infiltrate into the space within the chamber 20 (a space in the vicinity of the wafer W) only through the gap G and a small gap in the vicinity thereof. For this reason, when the size of the gap G may be reduced, it is possible to minimize an adverse impact by the processing liquid existing on the liquid receiving tray 42 and the vapor thereof on the humidity management of the space (the space in the vicinity of the wafer W) within the chamber 20.

Second Exemplary Embodiment of Fixed Supply Unit and Liquid Receiving Unit

Next, a second exemplary embodiment of the fixed supply unit 41 and liquid receiving unit 42, which are schematically illustrated in FIG. 2, will be described with reference to FIGS. 6 and 7. From the state where the processing liquid is ejected toward the central portion of the wafer W from the nozzle 410 and just after the opening/closing valve 433 of the processing liquid supply line 432 is closed, there arises a problem (e.g., occurrence of particles due to the scattering of droplets) since the processing liquid, which is dropping downwardly or obliquely downwardly due to the weakened fluid momentum thereof, arrives at constituent members of the processing unit 16 located outside the wafer W (e.g., the rotary cup body 502). In order to prevent this, the liquid receiving unit 42 is provided. In the second exemplary embodiment, the members which are the same or substantially the same as those of the first exemplary embodiments will be given the same symbols, and repeated descriptions will be omitted.

A certain recovery cup 50 includes a rotary cop body that is rotated together with the wafer W for the purpose of, for example, straightening the gas and processing liquid within the rotary cup 50. An example of a recovery cup 50 including such a rotary cup body is illustrated in FIG. 6. In the configuration of FIG. 6, a holding unit 31 includes a rotary plate 311, a plurality of wafer holding claws 312 attached to the rotary plate 311 (only one wafer holding claw is illustrated in FIG. 6). At least one of the wafer holding claws 312 is movable between a holding position for holding the peripheral edge of the wafer W and a release position spaced away from the peripheral edge of the wafer W. The recovery cup 50 includes a non-rotary cup body 501 located at the outside, and two rotary cup bodies 502, 503 provided inside the non-rotary cup body 501. The rotary cup bodies 502, 503 are attached to a post 504 fixed to the rotary plate 311. Accordingly, the rotary cup bodies 502, 503 rotate at an angular velocity which is the same as that of the wafer W.

Figure 7:
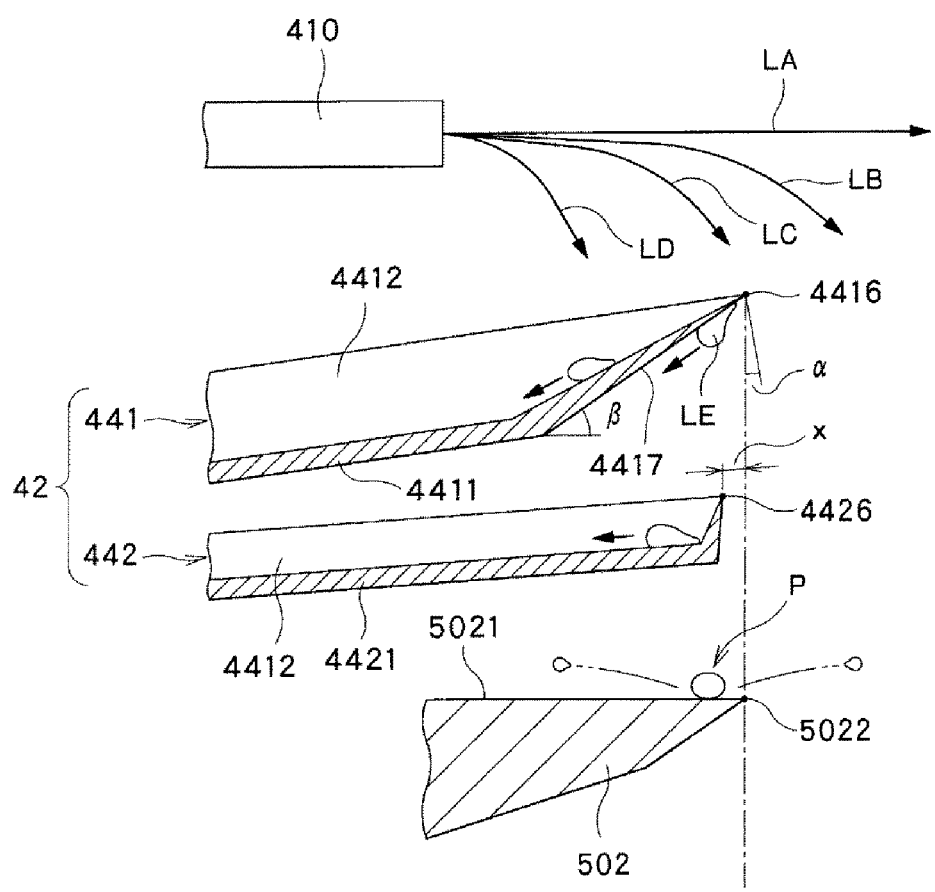
FIG. 7 is a view illustrating an action of the fixed supply unit and the liquid receiving unit according to the second exemplary embodiment.

When the processing liquid ejected from the nozzle 410 drops to the top surface of the rotary cup body 502 that rotates, the processing liquid is splashed to the rotary cup body 502 to be turned into minute droplets and scattered, which may cause generation of particles (see droplets illustrated by arrows P in FIG. 7). In order to prevent this, a liquid receiving unit 42 according to the second exemplary embodiment is provided. Descriptions of a configuration and an action of the recovery cup 50, which is not directly related to providing the liquid receiving unit 42, will be omitted herein. However, if it is desired, the configuration and the action may be understood with reference to Japanese Patent Laid-Open Publication No. 2014-123713 which is a publication of a patent application filed in the name of the assignee of the present application.

The liquid receiving unit 42 according to the second exemplary embodiment includes an upper liquid receiving tray 441, and a lower liquid receiving tray 442 positioned below the upper liquid receiving tray 441. The upper liquid receiving tray 441 and the lower liquid receiving tray 442 may be formed in, for example, a substantially rectangular shape in a plan view, but are not limited thereto.

The upper liquid receiving tray 441 includes a bottom wall 4411, one pair of side walls 4412 extending upward from the edge of the left and right ends of the bottom wall 4411, and a rear wall 4413. The side walls 4412 and the rear wall 4413 serve as a bank that prevent the processing liquid, which has dropped onto the bottom wall 4411, from overflowing and dropping from the upper liquid receiving tray 441. The bottom wall 4411 is inclined to descend as going in a direction opposite to the ejection direction of the processing liquid from the nozzle 410 (the rightward direction in the drawings of FIGS. 6 and 7) (that is, as the horizontal distance from a liquid arrival target place on the wafer W increases). At the rear end of the bottom wall 4411, a liquid discharge port 4414 is provided and connected to the outside of the chamber 20 through a liquid discharge tube 4415.

The lower liquid receiving tray 442 includes a bottom wall 4421, one pair of side walls 4422 extending upwardly from the edges of the left and right ends of the bottom wall 4421, and a rear wall 4423. The side walls 4422 and the rear wall 4423 serve as a bank that prevents the processing liquid, which has dropped onto the bottom wall 4421, from overflowing and dropping from the lower liquid receiving tray 442. The bottom wall 4421 is inclined to descend as going in a direction opposite to the ejection direction of the processing liquid from the nozzle 410. At the rear end of the bottom wall 4421, a liquid discharge port 4424 is provided and connected to the outside of the chamber 20 through a liquid discharge tube 4425.

As illustrated in FIG. 7, on the bottom surface of the bottom wall 4411, a region 4417 between the front end 4416 of the upper liquid receiving tray 441 and a position spaced backward away from the front end 4416 by a predetermined distance is inclined at a relatively large angle (forming an angle β in relation to a horizontal plane) to descend as the horizontal distance from the liquid arrival target place on the wafer W increases.

The horizontal distance from the liquid arrival target place on the wafer W to the front end 4416 of the upper liquid receiving tray 441 is smaller than the horizontal distance from the liquid arrival target place on the wafer W to the front end 4426 of the lower liquid receiving tray 442.

The horizontal distance from the liquid arrival target place on the wafer W (e.g., the central portion of the top surface of the wafer) to the front end 4416 of the upper liquid receiving tray 441 is equal to or slightly smaller than the horizontal distance from the liquid arrival target place on the wafer W to the inner peripheral edge 5022 of the top surface 5021 of the rotary cup body 502. That is, in relation to the ejection direction of the processing liquid from the nozzle 410, the front end 4416 of the upper liquid receiving tray 441 is located at a position that is equal to or is moved slightly ahead of that of the inner peripheral edge 5022 of the top surface 5021 of the rotary cup body 502.

Figure 6:
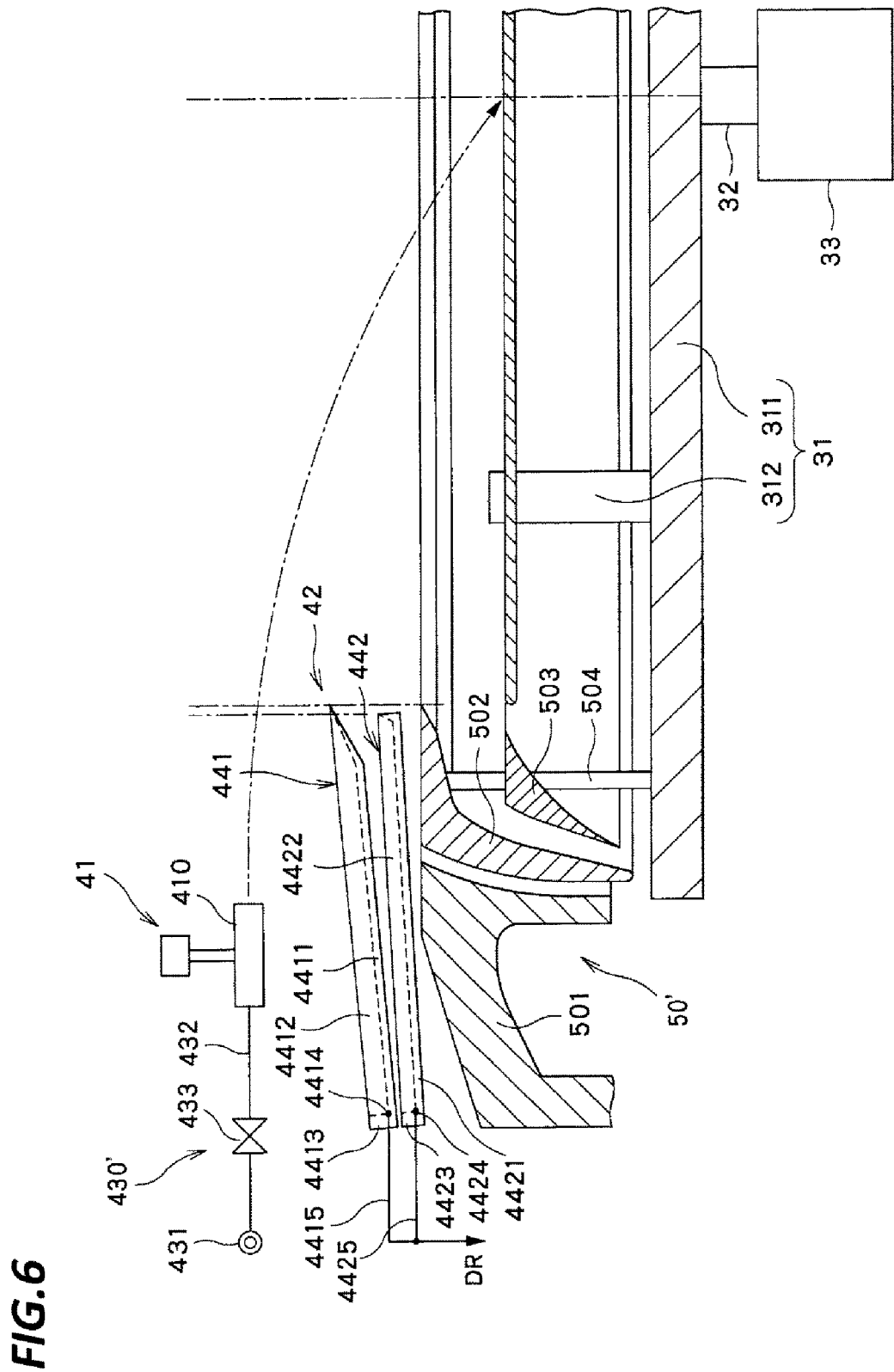
FIG. 6 is a vertical sectional view illustrating a part of a processing unit that includes a fixed supply unit and a liquid receiving unit according to a second exemplary embodiment.

When the processing liquid is ejected from the nozzle 410 with a fluid momentum that causes the processing liquid to arrive at the central portion of the top surface of the wafer W, the processing liquid flies above the upper liquid receiving tray 441 in a substantially horizontally direction (see a flight trace of the processing liquid indicated by a dashed line in FIG. 6 and a liquid flow LA in FIG. 7). When the opening/closing valve 433 (see FIG. 6) is closed from this state, the ejection of the processing liquid from the nozzle 410 is not immediately completely stopped, but the processing liquid with a low fluid momentum is ejected from the nozzle 410 within a very short time from the closing of the opening/closing valve 433. Thereafter, the ejection of the processing liquid from the nozzle 410 is stopped. At this time, as the fluid momentum is weakened, the flight traces of the processing liquid are changed sequentially as indicated by arrows LB, LC, LD. Even when the flight traces of the processing liquid are changed in this way, the droplets of the processing liquid are prevented from impinging against the top surface of the rotary cup body 502 since the upper liquid receiving tray 441 and the lower liquid receiving tray 442 are arranged as described above. This will be described in detail below.

Here, it shall be considered that when a droplet of the processing liquid drops in the vicinity of the front end 4416 of the upper liquid receiving tray 441 or in the vicinity of the front end 4426 of the lower liquid receiving tray 442, there occurs a phenomenon in which the droplet leaps over the front end 4416(4426) to turn into the rear surface of the liquid receiving tray 441(442) (the bottom surface of the bottom wall) due to the collapse of the droplets by the dropping, or by the kinetic energy of the droplets in a direction away from the nozzle 410 (see a droplet LE in FIG. 7). The droplet, which has turned into the rear surface, may flow in a direction away from the rotational central axis of the wafer along the rear surface as it is. In many cases, however, the droplet drops downward on its way. When the dropping position is on the top surface of the rotary cup body 502, the above-mentioned undesirable scattering of droplets occurs.

The angle α formed by the flight trace of the processing liquid with respect to a vertical line (see FIG. 7) is 0 degrees or more as long as there is no airflow that forces back the processing liquid to the nozzle 410 side. Accordingly, (i) since the horizontal distance of the front end 4416 of the upper liquid receiving tray 441 from the liquid arrival target place on the wafer W is equal to or slightly smaller than the horizontal distance of the inner peripheral edge 5022 of the top surface of the rotary cup body 502 from the liquid arrival target place, there is no processing liquid that directly impinges against the rotary cup body 502 without coming in contact with any of the upper liquid receiving tray 441 and the lower liquid receiving tray 442 after being ejected from the nozzle 410, regardless of the flight trace of the processing liquid.

In addition, (ii) since the horizontal distance of the front end 4416 of the upper liquid receiving tray 441 from the liquid arrival target place on the wafer W is smaller than that of the front end 4426 of the lower liquid receiving tray 442, there is also no processing liquid that impinges against the vicinity of the front end 4426 of the lower liquid receiving tray 442 without coming in contact with the upper liquid receiving tray 441 after being ejected from the nozzle 410. For this reason, there is also no case in which the processing liquid, which has impinged against the vicinity of the front end 4426 of the lower liquid receiving tray 442, drops onto the top surface 5021 of the rotary cup body 502 after the processing liquid has turned into the rear surface of the lower liquid receiving tray 442.

A part of the processing liquid, which has dropped in the vicinity of the front end 4416 of the upper liquid receiving tray 441, turns into the rear surface of the upper liquid receiving tray 441 (the bottom surface of the bottom wall) and flows leftward in FIG. 7 on the region 4417 of the front end portion of the bottom surface of the bottom wall 4411, and the greater part of the processing liquid drops onto the lower liquid receiving tray 442. If the droplet drops downward at a position in the vicinity of the front end 4416 just after turning into the rear surface of the upper liquid receiving tray 441, it is probable that the droplet, which has dropped, impinges against the vicinity of the front end 4426 of the lower liquid receiving tray 442, turns into the rear surface of the lower liquid receiving tray 442, and then drops onto the top surface 5021 of the rotary cup body 502. However, an undesirable event may be avoided by setting the angle β of the region 4417 of the front end portion of the bottom surface of the bottom wall 4411 in relation to the horizontal plane to be relatively large (e.g., 20 degrees or more), and setting a distance measured in the ejecting direction of the processing liquid from the nozzle 410, i.e. the distance X between the front end 4426 of the lower liquid receiving tray 442 and the front end 4416 of the upper liquid receiving tray 441 to be small.

According to the second exemplary embodiment, by arranging the upper liquid receiving tray 441 and the lower liquid receiving tray 442 to have the above-described positional relationship, it is possible to avoid the problem (e.g., occurrence of particles by the scattering of droplets) that may be caused as the processing liquid, which was ejected from the nozzle 410 just before stopping the ejection from the nozzle 410 and has a weakened fluid momentum, drops to a constituent member of the processing unit 16 (e.g., the rotary cup body 502) that is located outside the wafer W. In addition, even if the dropping position of the processing liquid having the weakened fluid momentum is located on a constituent member other than the rotary cup body 502 (e.g., the fixed cup body), the constituent member may be contaminated by the processing liquid. Thus, it is probable that the liquid splashed from the constituent member may contaminate a member around the constituent member. Accordingly, even in the processing unit 16 that does not include the rotary cup body 502, it is advantageous to provide the above-described upper liquid receiving tray 441 and lower liquid receiving tray 442.

The common effect of the first and second exemplary embodiments is that it is possible to prevent a processing liquid, which is ejected from the fixed nozzle at a fluid momentum lower than that at the time of normal ejection, from contaminating a constituent member of the processing unit 16 located outside a wafer W by dropping to the constituent member, and to prevent a droplet, which is splashed on the constituent member, from contaminating the constituent member and a member around the constituent member.

In the first and second exemplary embodiments, the term, "fixed" is appended to the name, "supply unit 41" in order to contrast the "fixed" supply unit 41 with the movable supply unit 43. However, the fixed supply unit 41 may not be completely immovable. In order to adjust the liquid arrival position on the substrate, for example, in order to change the ejecting angle of the processing liquid (an angle of elevation or an angle of depression in relation to a horizontal plane), a tilt mechanism may be provided in the fixed supply unit 41. Or, a moving mechanism, which may bring the fixed supply unit close to the liquid arrival target position [for example, including a case in which the nozzle 410 slightly protrude to the upper side of the wafer] or away from the liquid arrival target position, may be provided. When such a moving mechanism is provided, the liquid receiving unit 42 may be completely immovable, or a moving mechanism, which moves the liquid receiving unit 42 to follow the movement of the fixed supply unit 41, may be provided. The configurations of the first and second exemplary embodiments are advantageous since the problems described in the background section still exist when the fixed supply unit 41 is not movable like the movable supply unit 43 even if it is slightly moved.

The first exemplary embodiment and the second embodiment may be combined with each other. That is, the upper liquid receiving tray 441 and the lower liquid receiving tray 442 of the second exemplary embodiment may be provided below the liquid receiving tray 420 of the first exemplary embodiment.

In the above-described exemplary embodiments, the substrate to be processed in the processing unit 16 is not limited to a semiconductor wafer, and may be any substrate used in the technical field of manufacturing a semiconductor device such as, for example, a glass substrate for an LCD, or a ceramic substrate.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate liquid processing apparatus comprising:
   a substrate holding unit configured to hold a substrate horizontally;
   a nozzle configured to eject a processing liquid in a transversal direction onto the substrate held by the substrate holding unit from an ejection port which is provided outside a peripheral edge of the substrate;
   a recovery cup disposed around the substrate and configured to recover the processing liquid after the processing liquid is supplied to the substrate; and
   a liquid receiving unit provided separately from the recovery cup below the nozzle and above a top surface of the recovery cup to receive the processing liquid dropping from the ejection port of the nozzle,
   wherein the liquid receiving unit is provided to receive the processing liquid at a position radially outside the peripheral edge of the substrate in a plan view, the liquid receiving unit includes a liquid receiving member, a first guide wall extending downwardly from an opening end of the ejection port of the nozzle, and a second guide wall facing the first guide wall, a gap is formed between the first guide wall and the second guide wall, through which the processing liquid is guided to the liquid receiving member, an upper side of the liquid receiving member is covered by a cover, and the cover is formed by a portion of a holding member configured to hold the nozzle at a predetermined position.

2. The substrate liquid processing apparatus of claim 1, wherein a contact angle of the processing liquid in relation to the second guide wall is larger than a contact angle of the processing liquid in relation to the first guide wall.

3. The substrate liquid processing apparatus of claim 2, wherein a surface of the first guide wall is positioned on a plane that is the same as that of the opening end of the nozzle.

4. The substrate liquid processing apparatus of claim 2, wherein the gap has a size that is smaller to a size of a droplet ejected from the ejection port of the nozzle.

5. The substrate liquid processing apparatus of claim 1, wherein the second guide wall is formed integrally with the liquid receiving member.

6. The substrate liquid processing apparatus of claim 1, wherein the liquid receiving unit includes an upper liquid receiving member and a lower liquid receiving member located below the upper liquid receiving member.

7. The substrate liquid processing apparatus of claim 6, wherein a front end portion of a bottom surface of the upper liquid receiving member is inclined to descend as a horizontal distance from a liquid arrival target position increases, and a horizontal distance of a front end edge of the upper liquid receiving member from the liquid arrival target position is smaller than a horizontal distance of a front end edge of the lower liquid receiving member from the liquid arrival target position.

8. The substrate liquid processing apparatus of claim 7, further comprising:

a recovery cup disposed around the substrate so as to recover the processing liquid after the processing liquid is supplied to the substrate, wherein the recovery cup includes a ring-shaped rotary cup body configured to rotate around a vertical axis, and the horizontal distance of the front end edge of the upper liquid receiving member from the liquid arrival target position is equal to or smaller than a horizontal distance of an inner peripheral edge of a top surface of the rotary cup body from the liquid arrival target position.

9. The substrate liquid processing apparatus of claim 7, wherein, on the bottom surface of the upper liquid receiving member, a region between a front end of the upper liquid receiving member and a position spaced away from the front end of the upper liquid receiving member toward a rear end of the upper liquid receiving member by a predetermined distance is angled at a right upper direction by a predetermined angle.

10. The substrate liquid processing apparatus of claim 9, wherein the predetermined angle is 20 degrees or more.

* * * * *